(12) United States Patent
Gregorius et al.

(10) Patent No.: US 7,269,093 B2
(45) Date of Patent: Sep. 11, 2007

(54) GENERATING A SAMPLING CLOCK SIGNAL IN A COMMUNICATION BLOCK OF A MEMORY DEVICE

(75) Inventors: Peter Gregorius, München (DE); Martin Streibl, Petershausen (DE)

(73) Assignee: Infineon Technologies AG, Munich (DE)

(*) Notice: Subject to any disclaimer, the term of this patent is extended or adjusted under 35 U.S.C. 154(b) by 91 days.

(21) Appl. No.: 11/264,060

(22) Filed: Oct. 31, 2005

(65) Prior Publication Data

US 2007/0097779 A1 May 3, 2007

(51) Int. Cl.
*G11C 8/00* (2006.01)

(52) U.S. Cl. .................................. 365/233; 365/233.5

(58) Field of Classification Search ................ 365/233, 365/233.5; 711/105
See application file for complete search history.

(56) References Cited

U.S. PATENT DOCUMENTS

| 6,442,644 | B1 * | 8/2002 | Gustavson et al. | ......... 711/105 |
| 6,675,272 | B2 * | 1/2004 | Ware et al. | ................ 711/167 |

* cited by examiner

*Primary Examiner*—Vu A. Le
(74) *Attorney, Agent, or Firm*—Dicke, Billig & Czaja, PLLC

(57) ABSTRACT

A method generates a sampling clock signal in a communication block of a memory device having a plurality of communication blocks which are distributed in the memory device. The method includes receiving an input clock signal in the communication block, generating, only in response to the input clock signal, a local clock signal having a predetermined phase relationship with respect to the input clock signal, and generating the sampling clock signal based on the local clock signal.

34 Claims, 8 Drawing Sheets

GENERATING A SAMPLING CLOCK SIGNAL IN A COMMUNICATION BLOCK OF A MEMORY DEVICE

BACKGROUND

In present computer systems, a main memory accessible in both read and write operations (e.g., random access memory (RAM)) is typically implemented by using one or more memory modules which each comprise a plurality of memory devices each implemented on a single semiconductor chip. In particular, these memory devices or memory chips may be, for example, double data rate type (DDR-type). For operating the memory, data communication is not only between a memory controller and the memory modules, but also between the different memory devices of a memory module. For this purpose, the memory devices are provided with a plurality of communication blocks for receiving data from other memory devices or the memory controller and transmitting data to other memory devices or the memory controller. In order to achieve a high data bandwidth for the operation of the memory, high speed serial communication links are used for the data transfer.

In the memory device, the communication blocks are typically positioned at different locations (i.e., the communication blocks are distributed in the memory device). Therefore, clock signals are distributed in the memory device so as to allow for generating the required sampling clock signals for receiving and transmitting data.

FIG. 9 illustrates an on-chip clock distribution network of a conventional memory device. As illustrated, the memory device comprises a plurality of communication blocks 112, 113, 114, 115 which are distributed in the memory device (i.e., positioned at different locations on the semiconductor chip of the memory device). Further, the memory device comprises a main clock generating unit 110 which receives an external reference clock CLK_IO and further external clock signals CLK_RS, CLK_RP for distribution in the memory device. The reference clock signal CLK_IO is typically received from a memory controller or an external clock source. The clock signals CLK_RS and CLK_RP are typically received from other memory devices.

Each of the communication blocks comprises a receiver and a transmitter. In particular, a first communication block 112 comprises a primary transmitter RP and a secondary receiver RS. A second communication block 113 comprises a primary receiver RP and a secondary transmitter TS. Similarly, a third communication block 114 comprises a secondary receiver RS and a primary transmitter TP, and a fourth communication block comprises a primary transmitter TP and a secondary receiver RS.

In the communication blocks 113 and 115, the primary receiver RP receives data from the memory controller or from a previous memory device in a daisy-chain configuration. The secondary transmitter TS transmits data to a next memory device of the daisy-chain configuration. In the communication blocks 112 and 114, the secondary receiver RS receives data from the next memory device of the daisy-chain configuration and the primary transmitter TP transmits data to the previous memory device of the daisy-chain configuration or to the memory controller.

Each of the communication blocks 112, 113, 114, 115 comprises two local clock generating units 120, one for the receiver RP, RS and the other for the transmitter TP, TS. The local clock generating units 120 generate a sampling clock signal SCLK for the receiver RP, RS or for the transmitter TP, TS.

The clock distribution as illustrated in FIG. 10 is based on a master delay-locked loop (MDLL) in the main clock generating unit 110 and slave delay line (SDLL) 122 in each of the local clock generating units 120.

The MDLL comprises a delay chain which receives as its input signal the reference clock signal CLK_IO and generates a delayed output signal. The MDLL further comprises a phase detector which compares the delayed output signal of the delay chain with the reference clock signal and generates an internal control signal so as to adjust the delay of the delay chain. On the basis of the internal delay control signal, a control signal CS is generated which is distributed to each of the local clock generating units 120. The SDLLs 122 in the local clock generating units 120 comprise a delay chain which is configured substantially identical to the delay chain of the MDLL in the main clock generating unit 110 and are adjusted by the control signal CS to provide a delay which substantially corresponds to the delay of the MDLL in the main clock generating unit 110.

To the SDLLs 122 of the local clock generating units 120, a corresponding input clock signal is supplied which is delayed by a SDLL 122 so as to provide a local clock signal having a predetermined phase relationship with respect to the input clock signal of the SDLL. In case of the primary receivers RP, the input clock signal of the corresponding SDLL 122 is formed by the clock signal CLK_RP. In case of the secondary receivers RS, the input clock signal of the corresponding SDLL 122 is formed by the clock signal CLK_RS. In case of the primary and secondary transmitters TP, TS, the input clock signal of the corresponding SDLL 122 is formed by an internal clock signal CLK_IN. A multiplexer 116 selects the internal clock signal CLK_IN of the memory device from the reference clock signal CLK_IO and from the externally supplied clock signal CLK_RP. Output clock signals CLK_TP and CLK_TS are generated on the basis of an output signal of a main clock generating unit 110 so as to have a predetermined phase relationship with respect to the reference clock signal CLK_IO.

Each of the local clock generating units 120 further comprises a phase interpolator 124 so as to generate the sampling clock signal SCLK for the corresponding receiver RS or transmitter TP on the basis of the local clock signal provided by the SDLL 122. Therefore the SDLL 122 is configured to provide at least two local clock signals as output signals of its delay chain, each of the local clock signals having a predetermined phase relationship with respect to the input clock signal of the SDLL 122. By interpolating these at least two local clock signals, the phase relationship of the sampling clock signal SCLK with respect to the input clock signal of the SDLL can be adjusted in response to a corresponding phase control signal CT1-CT8 of the phase interpolator 124. Similarly, the output clock signals CLK_TP and CLK_TS are generated on the basis of a local output clock signal of the MDLL in the main clock generating unit 110 by phase interpolation in response to control signals CT9 and CT10, respectively, via phase interpolators 118.

With the above-described conventional approach for locally generating sampling clock signals in the communication blocks of the memory device there exist, however, problems as to a complex distribution of both clock and control signals. In particular, not only the clock signals CLK_IN, CLK_RS, and CLK_RP have to be distributed within the memory device, but also the control signal CS. This may cause problems with respect to disturbances due to insufficient isolation between lines on the semiconductor chip or may result in a poor signal quality, in particular when the clock and control signals have to be distributed over long distances on the semiconductor chip of the memory device.

In view of the above, there is a need for the present invention.

SUMMARY

One aspect of the present invention provides a method of generating a sampling clock signal in a communication block of a memory device having a plurality of communication blocks which are distributed in the memory device. The method includes receiving an input clock signal in the communication block, generating, only in response to the input clock signal, a local clock signal having a predetermined phase relationship with respect to the input clock signal, and generating the sampling clock signal based on the local clock signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
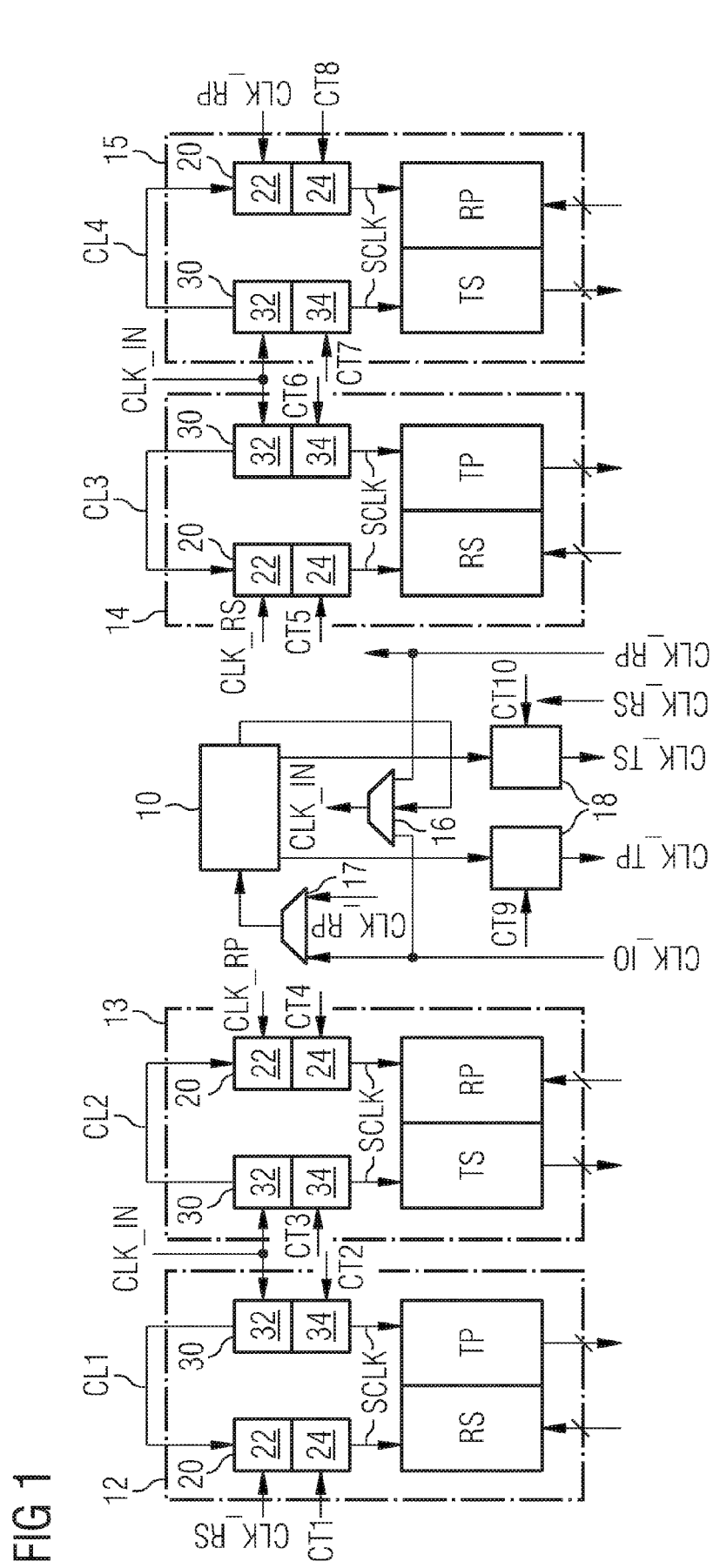
FIG. 1 schematically illustrates the generation of sampling clock signals in a memory device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the present invention relates to generating and distributing clock signals in a memory device, and more particularly to generating a sampling clock signal in a communication block of a memory device having a plurality of communication blocks which are distributed in the memory device. In some embodiments, memory devices are implemented on a semiconductor chip for use in memory modules of computer systems.

One embodiment provides an improved way of locally generating sampling clock signals in a communication block of a memory device.

One embodiment provides an improved method of generating a sampling clock signal in a communication block of a memory device having a plurality of communication blocks which are distributed in the memory device.

One embodiment provides a method of generating a sampling clock signal in a communication block of a memory device having a plurality of communication blocks which are distributed in the memory device. The method comprises receiving an input clock signal in the communication block, generating, only in response to the input clock signal, a local clock signal having a predetermined phase relationship with respect to the input clock signal, and generating the sampling clock signal on the basis of the local clock signal. The sampling clock signal may then be supplied to a receiver or a transmitter of the communication block.

In one embodiment, the method further comprises generating a local control signal in the communication block in response to the input clock signal of the communication block and generating a further local clock signal in response to a further input clock signal of the communication block and in response to the local control signal. A further sampling clock signal (e.g., a sampling clock for a further receiver or further transmitter) is then generated on the basis of the further local clock signal.

In one embodiment, an alternative method generates a sampling clock signal in a communication block of a memory device having a plurality of communication blocks which are distributed in the memory device. This method comprises receiving a control signal in the communication block, generating, only in response to the control signal, a local clock signal having the same frequency as a reference clock signal, and generating the sampling clock signal on the basis of the local clock signal. In this case, the control signal can be a digital control signal. The control signal may be generated by supplying the reference clock signal to a phase-locked loop and then generating the control signal on the basis of an internal control signal of the phase-locked loop.

In one embodiment, a further alternative method generates a sampling clock signal in a communication block of a memory device having a plurality of communication blocks which are distributed in the memory device. This method comprises supplying a reference clock signal to a phase-locked loop, generating a control signal on the basis of an internal control signal of a phase-locked loop, receiving the control signal in the communication block, generating a local clock signal having a predetermined phase relationship with respect to an input clock signal of the communication block in response to the input clock signal and in response to the control signal, and generating the sampling clock signal on the basis of the local clock signal.

In each of the above described methods embodiments generating the sampling clock signal on the basis of the local clock signal can involve generating the sampling clock signal by phase interpolation of at least two of the local clock signals. Moreover, the methods may also involve adjusting the phase relationship of the sampling clock signal in response to a phase control signal.

In one embodiment of a memory device includes a plurality of communication blocks which are distributed in the memory device and allows for an improved generation of a sampling clock signal in each of the communication blocks. In the memory device, each communication block comprises a local clock generating unit for receiving an input clock signal and generating, only in response to the input clock signal, a local clock signal having a predetermined phase relationship with respect to the input clock signal, the communication block being configured to generate a sampling clock signal (e.g., a sampling clock for a transmitter or a receiver) on the basis of the local clock signal. The local clock generating unit can comprise a delay-locked loop.

In one embodiment, each communication block comprises a further local clock generating unit for receiving a further input clock signal and generating a further local clock signal in response to the further input clock signal and in response to a local control signal supplied by the local clock generating unit (e.g., the local clock generating unit and the further local clock generating unit of the communication block may be configured according to a master-slave-configuration). In this case, the communication block can generate a further sampling clock signal (e.g., a sampling clock for a further receiver or a further transmitter) on the basis of the further local clock signal.

In one embodiment, the local clock generating unit may comprise a delay-locked loop configured as a master delay-locked loop and the further local clock generating unit may comprise a delay line configured as a slave delay line. According to the master-slave-configuration, the slave delay line comprises controllable delay means which are configured substantially identical to controllable delay means of the master delay-locked loop. The delay means of the slave delay line are controlled by the local control signal which is generated on the basis of an internal control signal of the master delay-locked loop.

The memory device can further comprises a main clock generating unit for generating the input clock signal of the local clock generating unit. The main clock generating unit can comprise a phase-locked loop. Alternatively, the main clock generating unit may comprise a delay-locked loop.

One embodiment of a memory device includes a plurality of communication blocks which are distributed in a memory device and allows for an improved generation of a sampling clock signal in each of the communication blocks. In the memory device, each communication block comprises a local clock generating unit for receiving a control signal and generating, only in response to the control signal received by the local clock generating unit, a local clock signal having the same frequency as a reference clock signal. Further, the local clock generating unit is configured to generate the sampling clock signal (e.g., a sampling clock for a receiver or a transmitter of the communication block) on the basis of the local clock signal.

The memory device can further comprises a main clock generating unit for generating the control signal. In particular, the main clock generating unit may comprise a phase-locked loop. In this case, the control signal supplied to the local clock generating units in the communication blocks can be generated on the basis of an internal control signal of the phase-locked loop.

In one embodiment, the local clock generating unit in each of the communication blocks can comprises a controlled oscillator which is configured substantially identical to a controlled oscillator of the phase-locked loop.

In one embodiment, a controlled oscillator of the phase-locked loop and the controlled oscillator of the local clock generating units each comprise a ring oscillator which is substantially formed by controllable delay means for delaying an input signal and a feedback path for coupling an output signal of the delay means back to the input of the delay means.

One embodiment of a memory device includes a plurality of communication blocks which are distributed in the memory device and allows for an improved generation of a sampling clock signal in each of the communication blocks. In the memory device, each communication block comprises a local clock generating unit for receiving an input clock signal and a control signal and for generating a local clock signal having a predetermined phase relationship with respect to the input clock signal in response to the control signal. Further, the local clock generating unit is configured to generate a sampling clock signal (e.g., a sampling clock for a receiver or transmitter of the communication block) on the basis of the local clock signal. Moreover, the memory device comprises a main clock generating unit having a phase-locked loop for generating the control signal supplied to the local clock generating units of the communication blocks.

In this case, a controlled oscillator of the phase-locked loop can comprises a ring oscillator having controllable delay means for delaying an input signal and a feedback path for coupling an output of the delay means back to the input of the delay means. The local clock generating unit can comprise controllable delay means for delaying the input clock signal, which are configured substantially identical to the controllable delay means in the ring oscillator of the phase-locked loop.

The local clock generating units in the above-mentioned memory devices embodiments can comprise phase interpolation means for generating the sampling clock signal. For this purpose, the local clock generating unit can be configured to generate at least two of the local clock signals, the local clock signals having a predetermined phase relationship with respect to each other or, if an input clock signal is supplied to the local clock generating unit, to the input clock signal of the local clock generating unit. For this purpose, the local clock generating units can comprise controllable delay means which are provided with a delay chain having a plurality of delay elements. In this case, at least two clock signals are available at corresponding outputs of the delay elements of the delay chain and can be used as input signals for a phase interpolation means.

In one embodiment, if more than two of the local clock signals are supplied to the phase interpolation means, the phase interpolation may also include selecting two input clock signals from the input clock signals for interpolation.

In one embodiment, the memory devices are implemented on a single semiconductor chip.

In the following, the embodiments are explained with reference to examples relating to the generation of sampling clock signals in memory devices, such as RAM-memory chips of the DDR-type. The description focuses on communication structures of the memory device which are used for providing a high speed data communication between memory devices or memory chips of the same memory module. The communication structures may further be used for data communication between different memory modules or between a memory module and a memory controller.

FIG. 1 schematically illustrates the generation of sampling clock signals in a memory device according to one embodiment. As illustrated, the memory device comprises a plurality of communication blocks 12, 13, 14, 15 which are positioned at different locations of the semiconductor chip of the memory device. The communication blocks 12, 13, 14, 14 serve to establish a high-speed serial data communication to other memory devices or to a memory controller.

The memory device comprises a main clock generating unit 10 for receiving incoming clock signals and distributing the incoming clock signals in the semiconductor chip of the memory device. In particular, an input clock signal of the main clock generating unit 10 can be selected from a reference clock signal CLK_IO or a clock signal CLK_RP via a multiplexer 17. A further input clock signal of the memory device is formed by a clock signal CLK_RS. The clock signal CLK_IO is typically a reference clock signal provided by the memory controller or by an external clock source. The clock signals CLK_RS and CLK_RP can be received from other memory devices or other memory modules.

A first communication block 12 comprises a primary transmitter TP and a secondary receiver RS. A second communication block 13 comprises a primary receiver RP and a secondary transmitter TS. A third communication block 14 comprises a secondary receiver RS and a primary transmitter TP. A fourth communication block comprises a primary receiver RP and a secondary transmitter TS.

The primary and secondary receivers RP, RS and the primary and secondary transmitters TP, TS are configured to facilitate arranging a plurality of memory devices in a daisy-chain configuration. Specifically, the primary receivers RP of the second communication block 13 and of the fourth communication block 15 may receive data from a previous memory module of the daisy-chain configuration or from the memory controller. The secondary receivers RS of the first communication block 12 and of the third communication block 14 may receive data from a next memory device of the daisy-chain configuration or from the memory controller. The primary transmitters TP of the first communication block 12 and of the third communication block 14 may transmit data to a previous memory device of the daisy-chain configuration or to the memory controller. The secondary transmitters TS of the second communication block 13 and of the fourth communication block 15 may transmit data to a next memory device of the daisy-chain configuration or to the memory controller.

Each of the receivers RP, RS and of the transmitters TP, TS of the communication blocks 12, 13, 14, 15 receive a sampling clock signal SCLK from corresponding local clock generating unit 20, 30, of the communication blocks 12, 13, 14, 15.

In the first communication block 12, the sampling clock signal SCLK for the primary transmitter TP is generated by a first local clock generating unit 30. The first clock generating unit receives as its input clock signal an internal clock signal CLK_IN of the memory device and generates a local clock signal having a predetermined phase relationship with respect to the input clock signal only in response to the input clock signal. For this purpose, the first clock generating unit 30 comprises a delay-locked loop 32. As will be further described below, the delay-locked loop 32 comprises controllable delay means for receiving the input clock signal and generating a delayed output clock signal, and a phase detector for comparing the delayed output clock signal with the input clock signal and generating an internal control signal for controlling the controllable delay means.

In one embodiment, the delay means are formed by a delay chain comprising a plurality of delay elements. Therefore, in the locked state of the delay-locked loop, a local clock signal is available at each output of the delay elements of the delay chain, each of the local clock signals having a predetermined phase relationship with respect to the input clock signal of the delay-locked loop.

The local clock signals are supplied to a phase interpolator 34 which generates the sampling clock signal SCLK by selecting two of the plurality of local clock signals and interpolating these local clock signals so as to generate the sampling clock signal SCLK. The phase interpolator 34 is controlled by a phase control signal CT2. Consequently, the phase relationship of the sampling clock signal SCLK with respect to the input clock signal of the delay-locked loop 32 can be adjusted by means of the phase control signal CT2.

The first local clock generating unit 30 is further configured to generate a local control signal CL1 on the basis of the internal delay control signal of the delay-locked loop 32. The local control signal CL1 is supplied to a second local clock generating unit 20 which generates the sampling clock signal SCLK for the secondary receiver RS of the first communication block 12. The second local clock generating unit 20 is configured to receive as a further input clock signal of the first communication block 12 the clock signal CLK_RS and to generate a local clock signal having a predetermined phase relationship with respect to the further input clock signal CLK_RS in response to the local control signal CL1.

In one embodiment, the second local clock generating unit comprises a delay line 22 which comprises controllable delay means which are configured substantially identical to the controllable delay means of the delay-locked loop 32 of the first local clock generating unit 30. In particular, the controllable delay means of the delay line 22 comprise a delay chain having a plurality of delay elements as well. Therefore, a plurality of further local clock signals is available at the output of corresponding delay elements of the delay chain. The further local clock signals are supplied to a phase interpolator 24 of the second local clock generating unit 20. The phase interpolator 24 generates the sampling clock signal SCLK for the secondary receiver RS by selecting two from the plurality of further local clock signals and interpolating these two further local clock signals so as to generate the sampling clock signal SCLK for the secondary receiver RS.

The phase interpolator 24 of the second local clock generating unit 20 is controlled by a phase control signal CT1, thereby allowing to adjust the phase relationship of the sampling clock signal SCLK with respect to the further input clock signal of the first communication block 12.

As can be seen from the above, the first local clock generating unit 30 and the second local clock generating unit 20 are arranged in a master-slave-configuration, the second local clock generating unit being controlled in response to the local control signal CL1 provided by the first local clock generating unit 30.

As to the second communication block 13, the third communication block 14, and the fourth communication block, a similar configuration is provided. In particular, the second communication block 13 comprises a first local clock generating unit 30 which generally corresponds to that of the first communication block 12 and generates the sampling clock signal SCLK for the secondary transmitter TS. The phase interpolator 34 of the first local clock generating unit 30 of the second communication block 13 is controlled by a phase control signal CT3.

Further, the second communication block 13 comprises a second local clock generating unit 20 which generally corresponds to that of the first communication block 12 and generates the sampling clock signal SCLK for the primary receiver RP. The second local clock generating unit 20 of the second communication block 13 receives as its input clock signal the clock signal CLK_RP. The phase interpolator 24 of the second local clock generating unit 20 of the second communication block 13 is controlled by a phase control signal CT4. The first local clock generating unit 30 generates a local control signal CL2 which is supplied to the second local clock generating unit 20.

The structure of the third communication block 14 and of the fourth communication block 15 generally corresponds to that of the first communication block 12 and of the second communication block 13, respectively. The phase interpolator 34 of the first local clock generating unit 30 of the third communication block 14 is controlled by a phase control signal CT6, and the phase interpolator 24 of the second local clock generating unit 20 is controlled by a phase control signal CT5. The phase interpolator 34 of the first local clock generating unit 30 of the fourth communication block is controlled by a phase control signal CT7, and the phase interpolator 24 of the second local clock generating unit 20 of the fourth communication block 15 is controlled by a phase control signal CT8. In the third communication block 14, the first local clock generating unit 30 generates a local control signal CL3 which is supplied to the second local clock generating unit 20, and in the fourth communication block 15, the first local clock generating unit 30 generates a local control signal CL4 which is supplied to the second local clock generating unit 20.

The main clock generating unit 10 may comprise a delay-locked loop. By supplying the reference clock signal CLK_IO or the clock signal CLK_RP to the delay-locked loop of the main clock generating unit 10, the quality of the internal clock signal CLK_IN supplied to the communication blocks 12, 13, 14, 15 is improved with respect to the characteristics of the reference clock signal CLK_IO or the clock signal CLK_RP. Alternatively, the reference clock signal CLK_IO or the clock signal CLK_RP can be supplied directly to the communication blocks via the multiplexer 16.

According to one embodiment, the main clock generating unit 10 comprises a phase-locked loop rather than a delay-locked loop. By this means, the signal quality of the internal clock signal CLK_IN supplied to the communication blocks 12, 13, 14, 15 is further improved, as by means of the phase-locked loop the internal clock signal CLK_IN is newly generated with a high quality.

As further illustrated in FIG. 1, the memory device also comprises clock generating units 18 which are related to the main clock generating unit 10. The clock generating units 14 generate output clock signals CLK_TP and CLK_TS. The output clock signal CLK_TP and CLK_TS can for example be supplied to other memory devices of the daisy-chain configuration. The phase relationship of the output clock signals CLK_TP and CLK_TS with respect to the input clock signal of the main clock generating unit (i.e., with respect to either the reference clock signal CLK_IO or the clock signal CLK_RP) can be adjusted by phase control signals CT9 and CT10, respectively.

If the main clock generating unit 10 comprises a delay-locked loop, the clock generating units 18 may be essentially formed by phase interpolators which generate the output clock signals CLK_TP and CLK_TS by phase interpolation of at least two input clock signals having a predetermined phase relationship with respect to each other, the input clock signals of the phase interpolators being locally supplied by the main clock generating unit 10.

In case that the main clock generating unit 10 comprises a phase-locked loop, in one embodiment the clock generating units 18 are implemented with controllable oscillators corresponding to a controllable oscillator of the main clock generating unit 10 (i.e., as slave oscillators). In this case, a control signal would be generated on the basis of an internal control signal of the phase-locked loop of the main clock generating unit 10 and be supplied to the controllable oscillators of the clock generating units 18. The phase adjustment on the basis of the control signals CT9 and CT10 could then be easily done by using phase interpolators which are supplied by the controllable oscillator with at least two input clock signals having a predetermined phase relationship with respect to each other. As will be further explained below, a plurality of clock signals having a predetermined phase relationship with respect to each other can be generated by means of a ring oscillator comprising as a delay means a delay chain having a plurality of delay elements. A plurality of clock signals having a predetermined phase relationship with respect to each other would then be available at corresponding outputs of the delay elements. By using slave oscillators for generating the output clock signals CLK_TP and CLK_TS, these signals are provided with a high signal quality.

In the foregoing description, the phase control signals CT1-CT10 can be either analog control signals (i.e., a control voltage or a control current) or digital control signals. Also the local control signals CL1-CL4 can be either analog control signals or digital control signals. If the clock generating units 18 are implemented by using controllable oscillators, the control signal supplied from the main clock generating unit 10 can be either an analog control signal or a digital control signal.

The above-described embodiments for generating sampling clock signals in the communication blocks 12, 13, 14, 15 of the memory device can provide significant advantages as compared to conventional approach. In particular, no control signal has to be distributed over long distances on the semiconductor chip of the memory device. Rather, only a static or low speed control signal is distributed locally in each of the communication blocks 12, 13, 14, 15. Due to the possibility of generating the output clock signals CLK_TP and CLK_TS by means of controllable oscillators, a high signal quality can be provided for these clock signals. The same applies for the locally generated sampling clock signals SCLK.

Further, the signal quality of incoming clock signals, (i.e., the reference clock signal CLK_IO and the clock signal CLK_RP), is significantly improved before it is distributed to the communication blocks 12, 13, 14, 15 by being first supplied to the main clock generating unit 10 and then to the communication blocks 12, 13, 14, 15. Therefore, a clean clock signal from the main clock generating unit 10 can be used as the input clock signals of the first local clock generating unit 30 in the communication blocks 12, 13, 14, 15. A particularly high signal quality for the internal clock signal CLK_IN distributed within the memory device can be achieved by using the phase-locked loop in clock generating unit 10.

It is to be understood that the above-described arrangement could be easily modified by changing the allocation of the first local clock generating unit and the second clock generating unit with respect to the primary and secondary receivers RP, RS and to the primary and secondary transmitters TP, TS. Further, it would be possible to use a local clock generating unit corresponding to the structure of the first clock generating unit for each of the primary receivers RP, secondary receivers RS, primary transmitters TP, and secondary transmitters TS. In the latter case, also the distribution of the local control signals CL1-CL4 could be eliminated.

Finally, it should be understood that the illustrated number and structure of the communication blocks with respect to the receivers RP, RS and the transmitters TP, TS is only exemplary. In particular, the memory device could have more or less of the communication blocks, and the number of receivers and/or transmitters in the communication blocks could be varied, depending on the specific design of the memory device. Moreover, it is also possible to locate the primary receivers RP and the primary transmitters in the same communication block and to locate the secondary receivers RS and the secondary transmitters in the same communication block.

Figure 2:
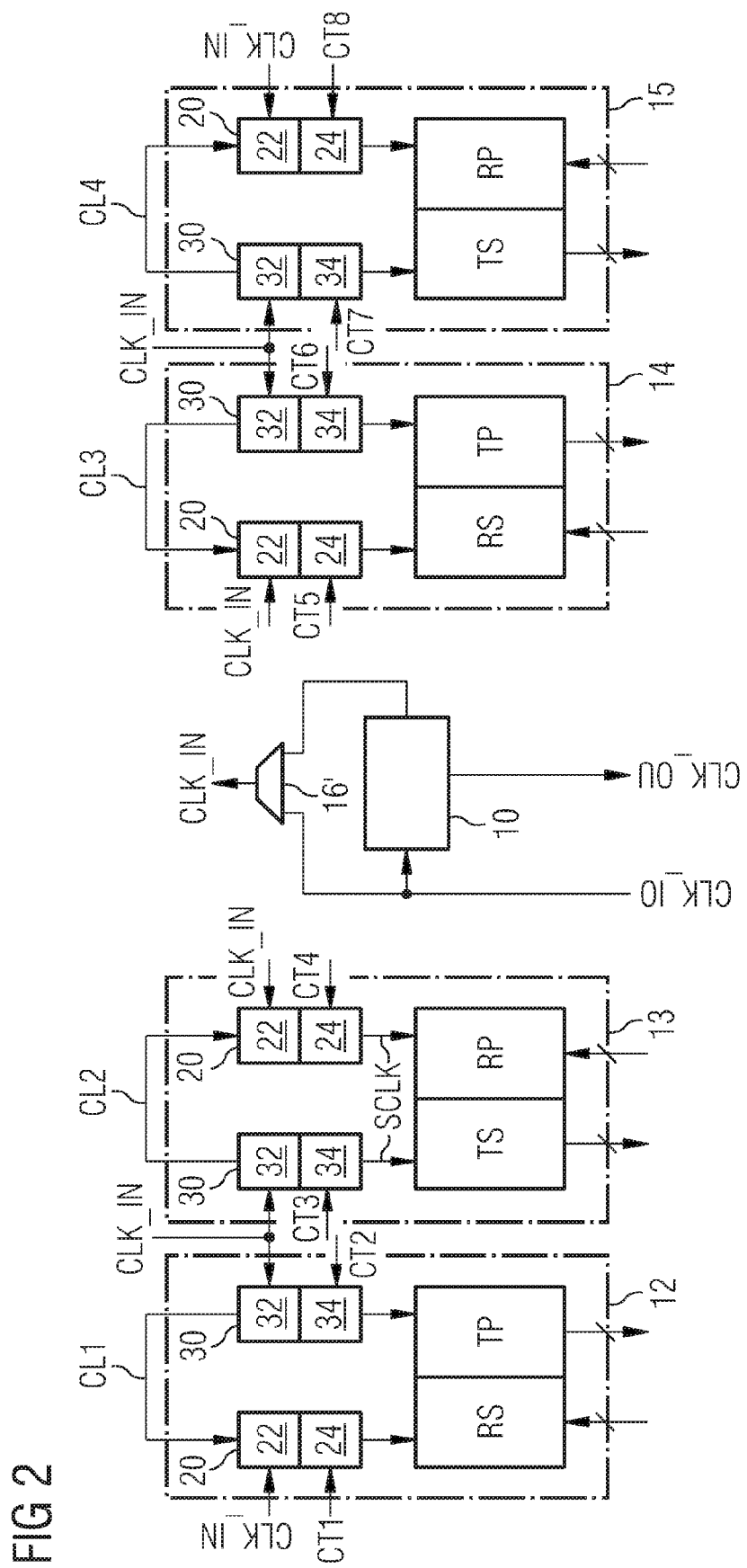
FIG. 2 schematically illustrates the generation of sampling clock signals in a memory device according to another embodiment.

FIG. 2 schematically illustrates the generation of sampling clock signals in communication blocks of a memory device according to another embodiment. The arrangement illustrated in FIG. 2 generally corresponds to that of FIG. 1 and similar components have been designated with the same reference signs. In the following, only the differences as compared to the arrangement of FIG. 1 will be described.

As compared to the arrangement of FIG. 1, in FIG. 2 a simplified structure of clock domains is provided. In particular, only the internal clock signal CLK_IN is distributed within the memory device. Consequently, each of the first local clock generating units 20 and each of the second clock generating units 30 receives as its input clock signal the internal clock signal CLK_IN supplied by the main clock generating unit 10. The main clock generating unit 10 receives as its input clock signal the external reference clock signal CLK_IO and generates an output clock signal which is distributed as the internal clock signal CLK_IN to each of the communication blocks 12, 13, 14, 15 and further generates an output clock signal CLK_OU of the memory device.

As compared to the arrangement of FIG. 1, the arrangement of FIG. 2 provides a significantly simplified structure as only one type of clock signal has to be distributed internally within the memory device. Again, the internal clock signal CLK_IN can be provided with an improved signal quality as compared to the reference clock signal CLK_IO by using the output clock signal of the main clock generating unit 10 as the internal clock signal CLK_IN to be distributed in the memory device, in particular if the main clock generating unit 10 comprises a phase-locked loop.

As further illustrated in FIG. 2, a multiplexer 16' is provided by means of which it can be selected to distribute either the reference clock signal CLK_IO or the output clock signal of the main clock generating unit 10 as the internal clock signal CLK_IN.

Figure 3:
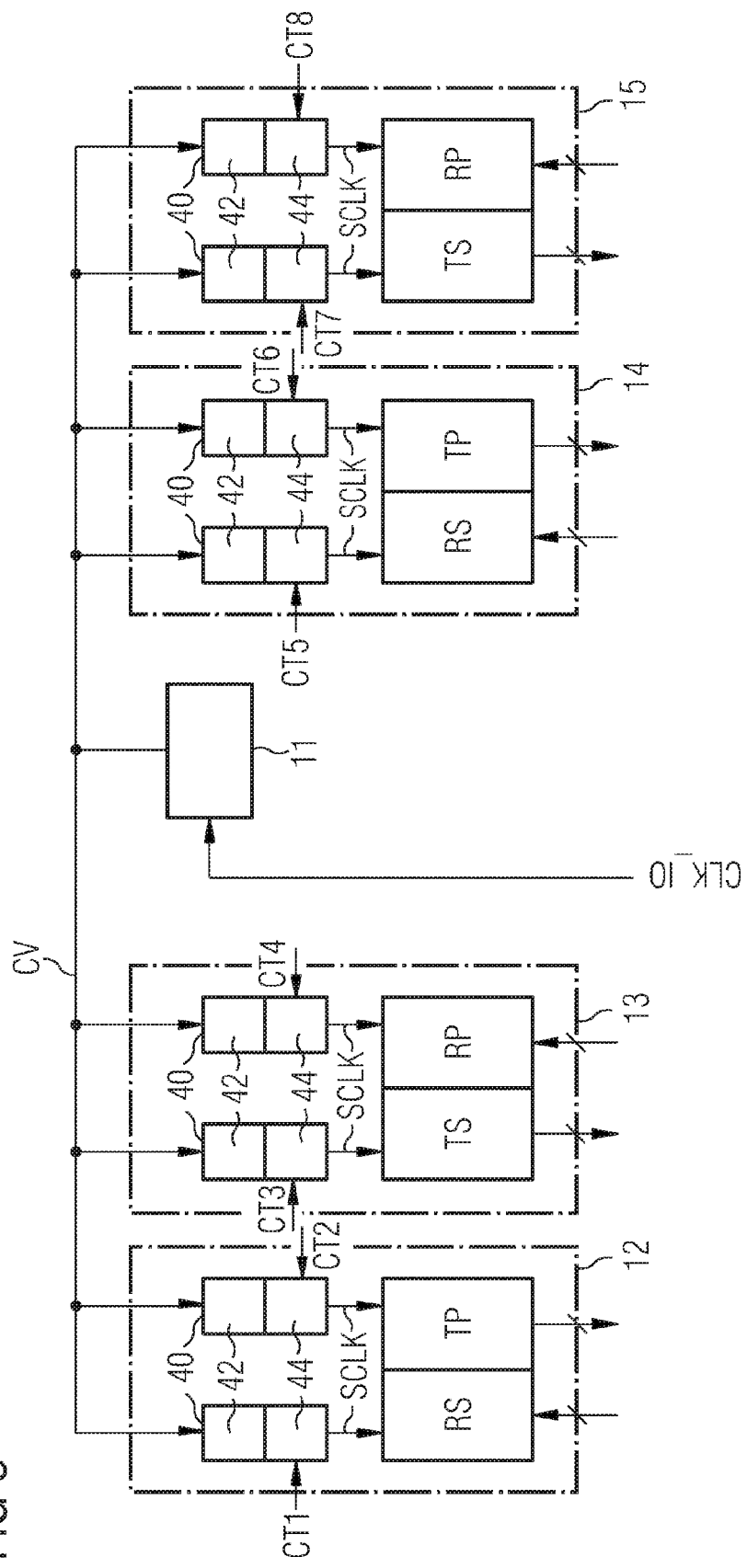
FIG. 3 schematically illustrates the generation of sampling clock signals in a memory device according to another embodiment.

FIG. 3 schematically illustrates the generation of sampling clock signals according to another embodiment. The general structure corresponds to that as described with reference to FIG. 1 and similar components have been designated with the same reference numerals. In the following, only the differences as compared to the arrangement of FIG. 1 will be described.

In contrast to the arrangement of FIG. 1, a different type of local clock generating unit is used in the communication blocks 12, 13, 14, 15. In particular, each communication block 12, 13, 14, 15 is provided with a pair of local clock generating units 40 which generate the sampling clock signals SCLK for the receivers RP, RS or the transmitters TP, TS. The local clock generating units 40 are supplied with a control signal CV from a main clock generating unit 11. However, no clock signal is internally distributed to the communication blocks 12, 13, 14, 15.

The local clock generating units 40 are configured to receive the control signal CV and to generate a local clock signal having the same frequency as the reference clock signal CLK_IO supplied to the main clock generating unit 11 only in response to the control signal CV received by the local clock generating unit. The local clock generating unit then generates the sampling clock signal SCLK for the receivers RP, RS or the transmitters TP, TS on the basis of the local clock signal.

In one embodiment, the main clock generating unit 11 comprises a phase-locked loop and each of the local clock generating units 40 is provided with a controlled oscillator 42.

As will be further explained below, the phase-locked loop of the main clock generating unit 11 comprises a controlled oscillator for generating an output clock signal, comparison means configured to receive the output clock signal of the controlled oscillator and the reference clock signal CLK_IO so as to generate a comparison signal depending on the phase difference and/or frequency difference of the output clock signal and the reference clock signal, and control means for generating an internal control signal of the phase-locked loop on the basis of the comparison signal. The controlled oscillator of the phase-locked loop is controlled in response to the internal control signal. The controlled oscillators 42 of the local clock generating units 40 are configured substantially identical to the controlled oscillator of the phase-locked loop in the main clock generating unit 11.

In this configuration, the control signal CV for controlling the controlled oscillators 42 of the local clock generating units 40 can be generated on the basis of the internal control signal of the phase-locked loop in the main clock generating unit 11. As can be seen, the arrangement of the main clock generating unit 11 and the local clock generating units 40 essentially corresponds to a master-slave-configuration. In particular, the controllable oscillators 42 of the local clock generating units 40 can be regarded as slave oscillators with respect to the controlled oscillator of the phase-locked loop in the main clock generating unit 11.

The controlled oscillators 42 in the local clock generating units 40 and the controlled oscillator of the phase-locked loop in the main clock generating unit 11 can be implemented by means of a ring oscillator. As will be further explained below, in one embodiment a ring oscillator comprises a delay means which is substantially configured as a delay chain having a plurality of delay elements. By this means, a plurality of local clock signals is available at corresponding outputs of the delay elements of the delay chain.

In the locked state of the phase-locked loop of the main clock generating unit 11, the local clock signals generated by the controlled oscillators 42 of the local clock generating units 40 are locked in frequency to the input signal of the phase-locked loop in the main clock generating unit 11, (i.e., to the reference clock signal CLK_IO). Consequently, in the controllable oscillators 42 of the local clock generating units 40, a plurality of local clock signals is available at corresponding outputs of the delay elements of the delay chain, the local clock signals having a predetermined phase relationship with respect to each other. In each of the local clock generating units 40, the local clock signals are supplied to a phase interpolator 44 which generates the sampling clock signal SCLK by phase interpolation of two local clock signals selected from the plurality of local clock signals. As in the configuration of FIGS. 1 and 2, the phase interpolators 44 are respectively controlled by the phase control signals CT1-CT8.

In the embodiment of FIG. 3, the controlled oscillator in the phase-locked loop of the main clock generating unit 10 and the controlled oscillators 42 of the local clock generating units are formed by voltage controlled oscillators, (i.e., controlled by an analog control signal). Accordingly, the control signal CV distributed to the communication blocks 12, 13, 14, 15 is an analog control signal. In one embodiment, the phase-locked loop of the main clock generating unit 11 is of a mixed-signal type in which parts of the phase-locked loop are digitally implemented, but control of the controlled oscillator is effected on the basis of an analog signal.

Figure 4:
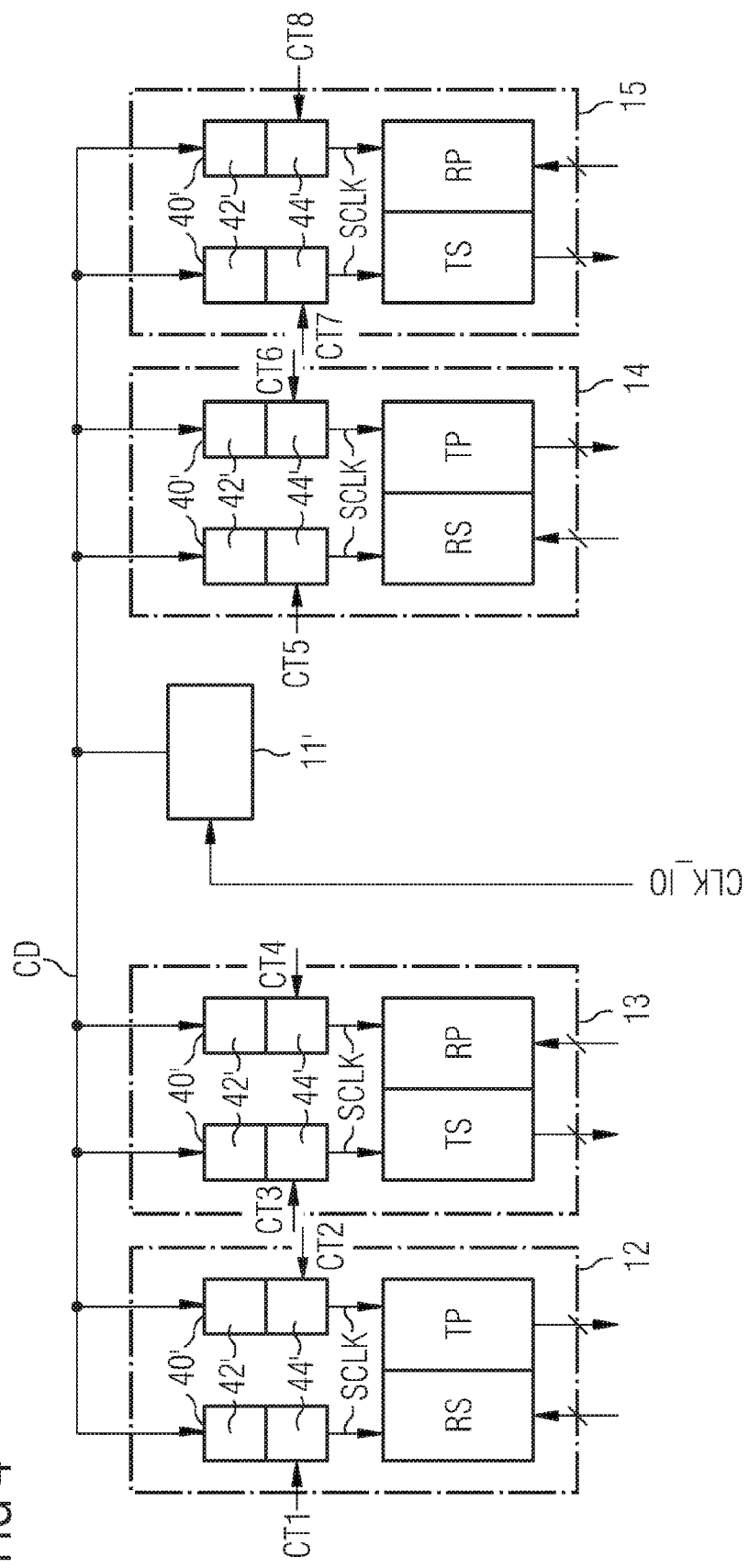
FIG. 4 schematically illustrates the generation of sampling clock signals in a memory device according to another embodiment.

FIG. 4 illustrates an embodiment which is a modification of the arrangement illustrated in FIG. 3. In FIG. 4, the voltage controlled oscillators 42 of FIG. 3 are replaced by digitally controlled oscillators 42'. Further, the main clock generating unit 11 is replaced by a main clock generating unit 11' having a digitally implemented phase-locked loop with a digitally controlled oscillator. Consequently, a digital control signal CD is distributed from the main clock generating unit 11' to each of the communication blocks 12, 13, 14, 15. The digital control signal CD is generated by the main clock generating unit 11' on the basis of an internal digital control signal of the phase-locked loop. Like in the arrangement of FIG. 3, the digitally controlled oscillators in the arrangement of FIG. 4 can be implemented as ring oscillators.

On the one hand, the use of digitally controlled oscillators provides a more precise control of the characteristics of the generated local clock signals. Further, digitally controlled oscillators may also be used in the clock generating units 18 for providing the output clock signals CLK_TP and CLK_TS. On the other hand, digital signals are less sensitive with respect to disturbances, thereby allowing distribution of the control signal CD over long distances.

The embodiments illustrated in FIGS. 3 and 4 can provide significant advantages as compared to conventional arrangements by having only a static or low speed control signal distributed over long distances on the semiconductor chip of the memory device. A complex distribution of clock signals is no longer necessary. Phase adjustment of the sampling clock signals can be easily accomplished locally in the communication blocks by using the phase interpolators 44 and the phase control signals CT1-CT8 in combination with local clock recovery techniques on received data signals.

Figure 5:
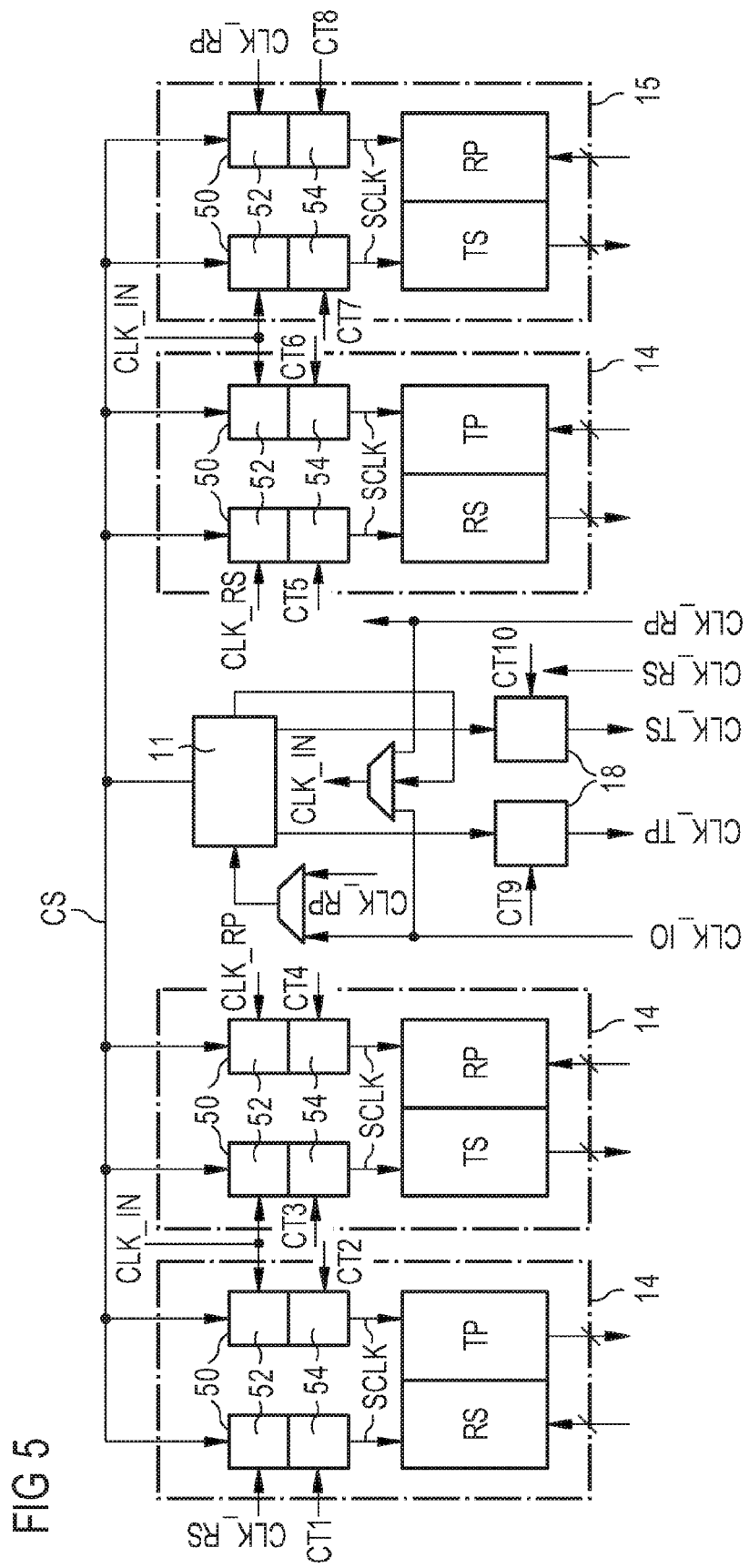
FIG. 5 schematically illustrates the generation of sampling clock signals in a memory device according to another embodiment.

FIG. 5 schematically illustrates the generation of sampling clock signals in a memory device according to another embodiment. The arrangement of FIG. 5 generally corresponds to that of FIG. 1 and similar components have been designated with the same reference signs. In the following, only the differences as compared to the arrangement of FIG. 1 will be explained.

In the arrangement of the embodiment of FIG. 5, the sampling clock signals SCLK for the receivers RP, RS and the transmitters TP, TS of the communication blocks 12, 13, 14, 15 are generated by means of local clock generating units 50. The local clock generating units 50 are configured to receive an input clock signal and a control signal and to generate a local clock signal having a predetermined phase relationship with respect to the input clock signal in response to the control signal. The sampling clock signal SCLK for the corresponding receiver RP, RS or transmitter TP, TS is then generated on the basis of the local clock signal. Further, a main clock generating unit 11 is provided which comprises a phase-locked loop for generating the control signal CS supplied to the local clock generating units 50. The main clock generating unit 11 is used to generate an internal clock signal CLK_IN to be distributed to at least some of the local clock generating units 50.

The main clock generating unit 11 generally has the same structure as the main clock generating unit 11 described in connection with FIG. 3. As described in connection with FIG. 4, it can comprise a digitally implemented phase-locked loop. The main clock generating unit 11 generates the control signal CS on the basis of an internal control signal of the phase-locked loop.

The local clock generating units 50 generally have a similar structure as the second local clock generating units 20 described in connection with FIG. 1. In particular, the local clock generating units 50 comprise a delay line 52 for delaying the input clock signal CLK_IN, CLK_RS or CLK_RP of the local clock generating unit 50. The delay line comprises controllable delay means which are implemented as a delay chain having a plurality of delay elements. The controllable delay means are controlled by the control signal CS provided by the main clock generating unit.

For generating the control signal CS, the phase-locked loop of the main clock generating unit 11 comprises a ring oscillator having delay means which are configured substantially identical to the delay means of the delay lines 52 in the local clock generating units 50. The implementation of the ring oscillator in the phase-locked of the main clock generating unit 11 and the implementation of the delay lines 52 in the local clock generating units 50 are further discussed below.

As further illustrated in FIG. 5, an output clock signal of the main clock generating unit 11 is distributed as the internal clock signal CLK_IN to the communication blocks 12, 13, 14, 15. Therefore, the communication blocks 12, 13, 14, 15 are provided with a high quality input clock signal. Alternatively, the clock signals CLK_RP or the reference clock signal CLK_IO can be selected to be distributed as the internal clock signal CLK_IN of the memory device via the multiplexer 16.

In the embodiment of FIG. 5, the control signal CS may be either an analog control signal, (i.e. a control voltage or a control current), or a digital control signal, depending on the implementation of the phase-locked loop in the main clock generating unit 11 and the implementation of the delay lines 52 in the local clock generating units 50.

As further illustrated, the local clock generating units 50 each comprise a phase interpolator 54 for generating the sampling clock signal SCLK on the basis of at least two local clock signals provided by the delay line 52. As already described for the local clock generating units 20, 30, the delay chain of the delay line 52 provides a plurality of local clock signals which are available at corresponding outputs of the delay elements of the delay line. The local clock signals are supplied to the phase interpolator 54 which generates the sampling clock signal by phase interpolation of two local clock signals selected from the plurality of local clock signals. The phase relationship of the generated sampling clock signal SCLK with respect to the input clock signal of the delay line 52 can be adjusted in response to the phase control signals CT1-CT8.

The arrangement of the embodiment illustrated in FIG. 5 can provide significant advantages as compared to the conventional arrangements. In particular, by using the output clock signal of the main clock generating unit 11 as the internal clock signal CLK_IN to be distributed to the communication blocks 12, 13, 14, 15, the communication blocks 12, 13, 14 can be provided with a high quality input clock signal. Further, a precise and robust control of the delay lines 52 in the local clock generating units 50 is possible with the control signal CS generated by means of the phase-locked loop. In particular, the quality of the control signal CS has less sensitivity with respect to the input clock signal CLK_IO of the main clock generating unit as the phase-locked loop inherently removes deficiencies of its input clock signal.

Further, the output clock signals CLK_TP and CLK_TS can be generated with a high quality by using controlled oscillators in the clock generating units 18.

Figure 6:
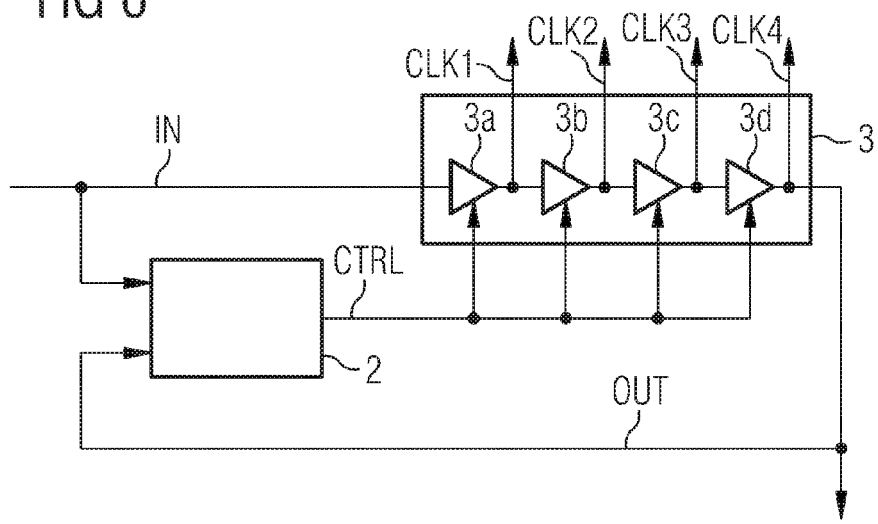
FIG. 6 schematically illustrates an embodiment of a delay-locked line for use in the embodiments of FIGS. 1 and 2.

FIG. 6 schematically illustrates an embodiment of a delay-locked loop as used in the first local clock generating units 30 in the embodiment of FIGS. 1 and 2. A similar delay-locked loop may also be used in the main clock generating unit 10.

The delay-locked loop comprises controllable delay means 3. The controllable delay means 3 include a delay chain having a plurality of delay elements 3a, 3b, 3c, 3d. Each of the delay elements is controlled by the same control signal CTRL. The delay elements 3a, 3b, 3c, 3d are configured to delay their respective input signal by a period of time depending on the control signal CTRL. A delayed output clock signal OUT of the delay means 3 is supplied to a phase detector 2 which compares the delayed output signal OUT with an input clock signal IN of the delay means 3. In response to the result of the comparison, the control signal CTRL is incremented or decremented, thereby increasing or decreasing the delay provided by the delay means 3. In the locked state of the delay-locked loop, (i.e., when the control signal CTRL assumes a substantially constant value), the output clock signal OUT and the input clock signal IN of the phase-locked loop have a predetermined phase relationship with respect to each other, (e.g., phase-shifted by 180°). In this state, delayed output clock signals CLK1, CLK2, CLK3, CLK4 can be tapped at the outputs of the delay elements 3a, 3b, 3c, 3d, respectively, each of the clock signals CLK1-CLK4 having a predetermined phase relationship with respect to the input clock signal IN, the phase-shift with respect to the input clock signal IN corresponding to a predetermined fraction of the phase-shift between the input clock signal IN and the output clock signal OUT.

In the delay-locked loops 32 of the first local clock generating units 30 of the embodiment illustrated in FIGS. 1 and 2, the clock signals CLK1-CLK4 correspond to the plurality of local clock signals supplied to the phase interpolator 34. In the second local clock generating unit 20 a substantially identical delay means 3 is provided. Here, the clock signals CLK1-CLK4 are supplied as the plurality of local clock signals to the phase interpolator 24. Similarly, if the main clock generating unit 10 comprises a delay-locked loop as illustrated in FIG. 6, the clock signals CLK1-CLK4 can be provided to phase interpolators in the clock generating units 18.

Figure 7:
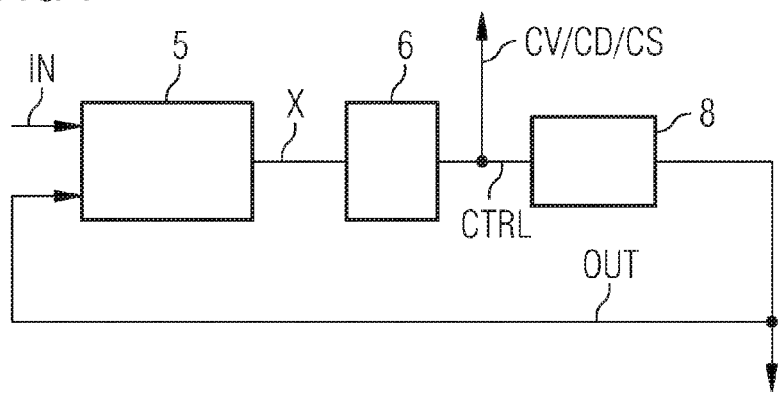
FIG. 7 schematically illustrates an embodiment of a phase-locked loop for use in the embodiments of FIGS. 1-5.

FIG. 7 schematically illustrates an embodiment of a phase-locked loop to be alternatively used instead of a delay-locked loop in the main clock generating unit 10 of FIGS. 1 and 2 or to be used in the main clock generating units 11, 11' of FIGS. 3-5.

The phase-locked loop comprises a controllable oscillator 8 which generates an output clock signal OUT. Together with an input clock signal IN of the phase-locked loop, the output clock signal OUT of the controlled oscillator 8 is supplied to a comparison means 5 in the form of a frequency-phase-detector. The comparison means 5 generates a comparison signal X in response to the frequency difference and/or the phase difference between the input clock signal IN and the output clock signal OUT, which are supplied to control means 6. The control means 6 are configured to generate an internal control signal CTRL for controlling the controlled oscillator 8. Depending on the specific configuration of the phase-locked loop, the control means 6 may comprise a charge pump and/or filters. In a fully digitally implemented phase-locked loop both the comparison signal X and the internal control signal CTRL are digital signals.

In the embodiments of FIGS. 3-5 the internal control signal CTRL of the phase-locked loop in the main clock generating unit 11, 11' is used as the control signal CV, CD, or CS supplied to the communication blocks 12, 13, 14, 15.

If the phase-locked loop is used in the main clock generating unit 10 of the embodiments as illustrated in FIGS. 1 and 2 and in the main clock generating unit 11 of the embodiment shown in FIG. 5, the output clock signal OUT of the phase-locked loop can further be used to be distributed as the internal clock signal CLK_IN to the communication blocks 12, 13, 14, 15.

As already mentioned, the controlled oscillator 8 of the phase-locked loop used according to the aforementioned embodiments can comprise a ring oscillator. A structure of an embodiment of a ring oscillator is schematically illustrated in the upper portion of FIG. 8.

The controlled oscillator 8 comprises delay means 9 which are substantially implemented as a delay chain having a plurality of delay elements 9a, 9b, 9c, 9d. The delay elements are each controlled by the same control signal CTRL. Each of the delay elements 9a, 9b, 9c, 9d delays its input signal by a specified period of time. The ring oscillator further comprises a feedback path for coupling an output signal of the last delay element 9d of the delay chain back to an input of the first delay element 9a of the delay chain. By means of the control signal CTRL, the oscillation frequency and the phase position of the output clock signal OUT of the ring oscillator can be controlled. In one embodiment illustrated in FIG. 8, a stable oscillation in the ring oscillator 8 can only be obtained under condition that the input clock signal of the delay chain 9 has a predetermined phase relationship, (e.g., a phase-shift of 360°), with respect to the output clock signal of the ring oscillator.

Figure 8:
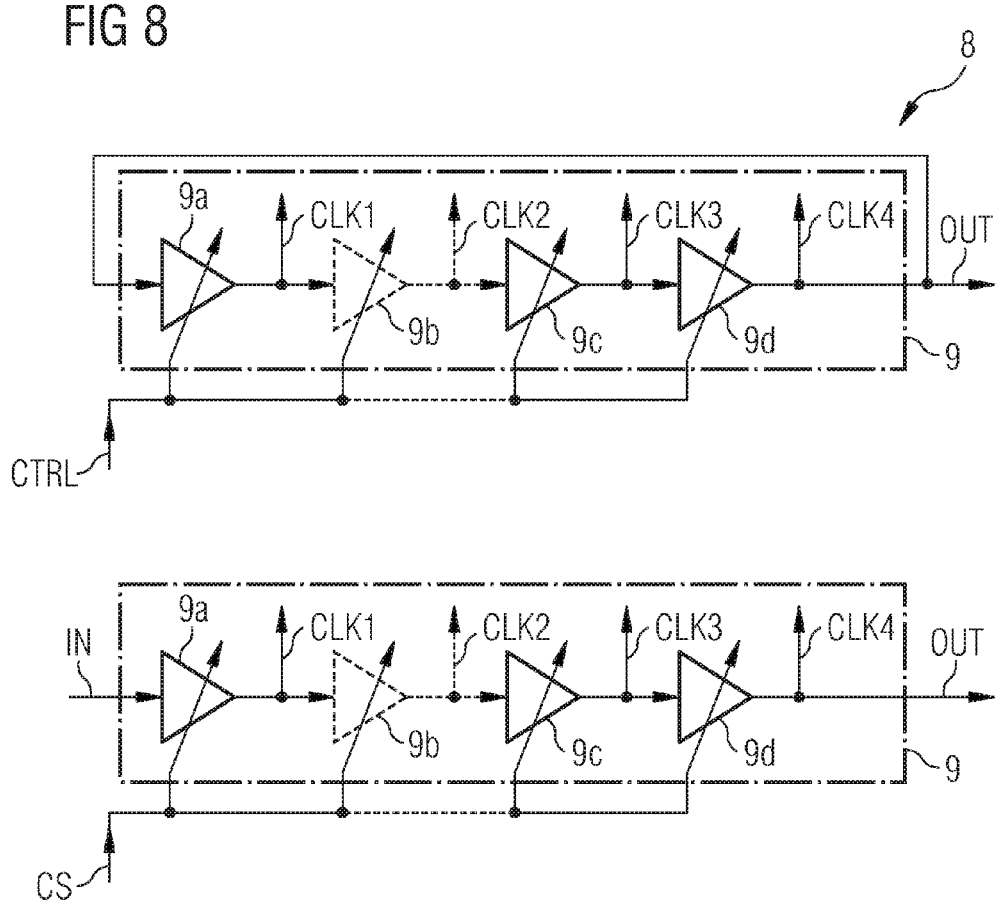
FIG. 8 schematically illustrates an embodiment of a ring oscillator and a corresponding embodiment of a delay chain.
Figure 9:
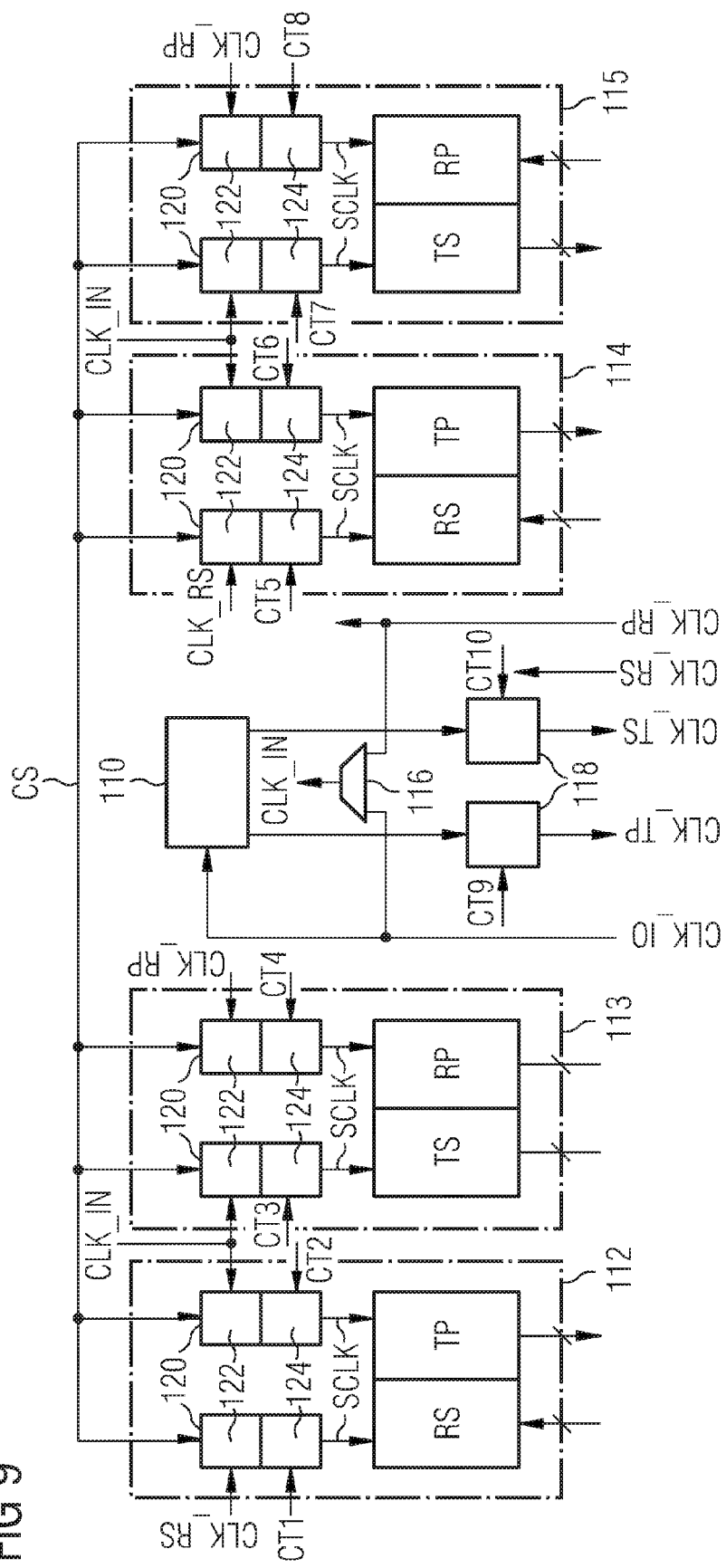
FIG. 9 schematically illustrates a conventional approach to generate sampling clock signals in a memory device.

The ring oscillator as illustrated in the upper part of FIG. 8 can be used in a phase-locked loop of the main clock generating units 10, 11, 11' shown in FIGS. 1-5 or in the local clock generating units 40, 40' shown in FIGS. 3 and 4.

The lower portion of FIG. 8 illustrates an embodiment of a delay line having delay means 9 which are configured substantially identical to the delay means 9 of the ring oscillator 8 as illustrated in the upper portion of FIG. 8. When using the control signal CTRL of the ring oscillator 8 for controlling the delay means 9 of the delay line as well, the output clock signal OUT of the delay means 9 will have a predetermined phase relationship with respect to the input clock signal IN, as long as the input clock signal IN of the delay means 9, as long as the input clock signal IN supplied to the delay means 9 of the delay line corresponds to the oscillation frequency of the ring oscillator 8. Therefore, by using the internal control signal CTRL supplied to the ring oscillator 8 of the phase-locked loop as the control signal CS supplied to the delay line 52 of the local clock generating units 50 in the embodiment of FIG. 5, at corresponding outputs of the delay elements 9a, 9b, 9c, 9d of the delay line 52, a plurality of clock signals CLK1, CLK2, CLK3, CLK4 is available, which have predetermined phase relationships with respect to the input clock signal of the delay line. Again, the plurality of clock signals CLK1-CLK4 are used as the local clock signals supplied to the phase interpolator 54.

In the foregoing, embodiments of the invention have been described which allow for improving the generation of sampling clock signals in a memory device having a plurality of communication blocks which are distributed in the memory device. It is to be understood that these embodiments have been described only by way of example and that the invention is not limited to specific details of these embodiments. For example, the simplified distribution of clock signals as illustrated in FIG. 2 could also be applied to the embodiment as described in FIG. 5. Moreover, it would also be possible to eliminate the phase interpolators and to generate the sampling clock signals directly by means of the delay-locked loop 32, the delay lines 22, 52, or the controlled oscillators 42, 42'. The detailed configurations of the delay-locked loop, the delay lines and the phase-locked loop used according to the embodiments can be modified depending on the specific requirements of the application.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of generating a sampling clock signal in a communication block of a memory device having a plurality of communication blocks which are distributed in the memory device, the method comprising:
   receiving an input clock signal in the communication block;
   generating, only in response to the input clock signal, a local clock signal having a predetermined phase relationship with respect to the input clock signal; and
   generating the sampling clock signal based on the local clock signal.

2. The method of claim 1, comprising:
   generating at least two of the local clock signals, each having a different phase relationship with respect to the input clock signal; and
   generating the sampling clock signal by phase interpolation of the at least two local clock signals.

3. The method of claim 1, comprising:
   generating a local control signal in the communication block in response to the input clock signal;
   generating a further local clock signal in response to a further input clock signal of the communication block and in response to the local control signal; and
   generating a further sampling clock signal based on the further local clock signal.

4. The method of claim 3, comprising:
   generating at least two of the further local clock signals, each having a different phase relationship with respect to the further input clock signal; and
   generating the further sampling clock signal by phase interpolation of the at least two further local clock signals.

5. The method of claim 1, comprising:
   supplying a reference clock signal to a delay-locked loop; and
   generating the input clock signal of the communication block based on an output signal of the delay-locked loop.

6. The method of claim 1, comprising:
   supplying a reference clock signal to a phase-locked loop; and
   generating the input clock signal of the communication block based on an output signal of the phase-locked loop.

7. A method of generating a sampling clock signal in a communication block of a memory device having a plurality of communication blocks which are distributed in the memory device, the method comprising:
   receiving a control signal in the communication block;
   generating, only in response to the control signal, a local clock signal having the same frequency as a reference clock signal; and
   generating the sampling clock signal based on the local clock signal.

8. The method of claim 7, comprising:
   generating at least two of the local clock signals, the at least two local clock signal having a predetermined phase relationship with respect to each other; and
   generating the sampling clock signal by phase interpolation of the at least two local clock signals.

9. The method of claim 7, comprising:
   supplying the reference clock signal to a phase-locked loop; and
   generating the control signal based on an internal control signal of the phase-locked loop.

10. A method of generating a sampling clock signal in a communication block of a memory device having a plurality of communication blocks which are distributed in the memory device, the method comprising:
    supplying a reference clock signal to a phase-locked loop;
    generating a control signal based on an internal control signal of the phase-locked loop;
    receiving the control signal in the communication block;
    generating a local clock signal having a predetermined phase relationship with respect to an input clock signal of the communication blocks in response to the input clock signal and in response to the control signal; and
    generating the sampling clock signal based on the local clock signal.

11. The method of claim 10, comprising:
    generating at least two of the local clock signals, each of the at least two local clock signals having a predetermined phase relationship with respect to the input clock signal; and
    generating the sampling clock signal by phase interpolation of the at least two local clock signals.

12. The method of claim 10, comprising:
    generating the input clock signal based on an output clock signal of the phase-locked loop.

13. A memory device comprising:
    a plurality of communication blocks distributed in the memory device, each communication block including:

a local clock generating unit configured to receive an input clock signal, to generate, only in response to the input clock signal, a local clock signal having a predetermined phase relationship with respect to the input clock signals, and to generate a sampling clock signal based on the local clock signal.

14. The memory device of claim 13, wherein the local clock generating unit comprises a delay-locked loop.

15. The memory device of claim 14, wherein the delay-locked loop comprises:
a controllable delayer configured to receive the input clock signal and to generate a delayed output clock signal; and
a phase detector configured to compare the delayed output clock signal with the input clock signal and to generate an internal control signal, wherein the delayer is controlled by the internal control signal.

16. The memory device of claim 15, wherein the controllable delayer of the delay-locked loop comprises a delay chain having a plurality of delay elements.

17. The memory device of claim 16, wherein at least two local clock signals are available at corresponding outputs of the delay elements or the delay chain, wherein the at least two local clock signals have a predetermined phase relationship with respect to the input clock signal.

18. The memory device of claim 17, wherein the local clock generating unit comprises phase interpolator configured to generate the sampling clock signal by phase interpolation of the at least two local clock signals.

19. The memory device of claim 17, wherein each communication block comprises:
a further clock generating unit configured to receive a further input clock signal, to generating a further local clock signal in response to the further input clock signal and in response to a local control signal from the local clock generating unit, and to generate a further sampling clock signal based on the further local clock signal.

20. The memory device of claim 19, wherein the local clock generating unit comprises a delay-locked loop including:
a controllable delayer configured to receive the input clock signal and to generate a delayed output clock signal;
a phase detector configured to compare the delayed output clock signal with the input clock signal and to generate an internal control signal, wherein the delayer is controlled by the internal control signal;
wherein the further local clock generating unit comprises a controllable delayer configured to receive the further input clock signal, the controllable delayer of the further local clock generating unit being configured substantially identical to the controllable delayer of the local clock generating unit; and
wherein the local clock generating unit is configured to generate the local control signal based on the internal control signal of the delay-locked loop.

21. The memory device of claim 20, wherein the controllable delayer of the local clock generating unit and the controllable delayer of the further local clock generating unit each comprise a delay chain having a plurality of delay elements.

22. The memory device of claim 21, wherein in the local clock generating unit at least two local clock signals are available at corresponding outputs of the delay elements of the delay chain, the at least two local clock signals having a predetermined phase relationship with respect to input clock signal, and wherein in the further local clock generating unit at least two further local clock signals are available at corresponding outputs of the delay elements of the delay chain, the at least two further local clock signals having a predetermined phase relationship with respect to the further input clock signal.

23. The memory device of claim 22, wherein the local clock generating unit comprises a phase interpolator configured to generate the sampling clock signal by phase interpolation of the at least two local clock signals; and
wherein the further local clock generating unit comprises a phase interpolator configured to generate the further sampling clock signal by phase interpolation of the at least two further local clock signals.

24. The memory device of claim 15, comprising:
a main clock generating unit for generating the input clock signal comprising a phase-locked loop.

25. The memory device of claim 15, wherein the memory device is implemented on a single semiconductor chip.

26. A memory device comprising:
a plurality of communication blocks which are distributed in the memory device, each communication block comprising:
means for receiving a control signal;
means for generating a local clock signal having the same frequency as a reference clock signal only in response to the control signal received by the local clock generating unit; and
means for generating a sampling clock signal based on the local clock signal.

27. The memory device of claim 26, comprising:
means for generating the control signal including a phase-locked loop, wherein the phase-locked loop comprises:
a controlled oscillator for generating an output clock signal;
comparison means for receiving the output clock signal of the controlled oscillator and the reference clock signal and for generating a comparison signal depending on a phase difference and/or a frequency difference of the output clock signal and the reference clock signal; and
control means for generating an internal control signal of the phase-locked loop based on the comparison signal, the controlled oscillator of the phase-locked loop being controlled in response to the internal control signal;
wherein the means for generating the local clock signal comprises a controlled oscillator configured substantially identical to the controlled oscillator of the phase-locked loop; and
wherein the means for generating the control signal is configured to generate the control signal based on the internal control signal of the phase-locked loop.

28. The memory device of claim 27, wherein the controlled oscillator of the phase-locked loop and the controlled oscillator of means for generating the local clock signal each comprise a ring oscillator, the ring oscillator comprising:
controllable delay means for delaying an input clock signal; and
a feedback path for coupling an output clock signal of the delay means back to an input of the delay means.

29. The memory device of claim 28, wherein the controllable delay means of the ring oscillator comprises a delay chain having a plurality of delay elements.

30. The memory device of claim 29, wherein, in the controlled oscillator of the means for generating the local clock signal, at least two local clock signals are available at corresponding outputs of the delay elements of the delay chain, the at least two local clock signals having a predetermined phase relationship with respect to each other.

31. The memory device of claim 30, wherein the means for generating the local clock comprises:
   phase interpolation means for generating the sampling clock signal by phase interpolation of the at least two local clock signals.

32. A memory device comprising:
   a main clock generating unit having a phase-locked loop configured to receiving a reference clock signal and to generate a control signal; and
   a plurality of communication blocks distributed in the memory device, each communication block including:
      a local clock generating unit configured to receiving an input clock signal and the control signal, to generate a local clock signal having a predetermined phase relationship with respect to the input clock signal in response to a control signal, and to generate a sampling clock signal based on the local clock signal.

33. The memory device of claim 32, wherein the main clock generating unit is configured to generate the input clock signal for the local clock generating unit.

34. The memory device of claim 32, wherein the phase-locked loop comprises:
   a controlled oscillator configured to generate an output clock signal;
   a comparator configured to receive the output clock signal of the controlled oscillator and the reference clock signal, and to generate a comparison signal depending on a phase difference and/or a frequency difference of the output clock signal and the reference clock signal; and
   a controller configured to generate an internal control signal of the phase-locked loop based on the comparison signal, the controlled oscillator of the phase-locked loop being controlled by the internal control signal, and
   wherein the main clock generating unit is configured to generate the control signal based on the internal control signal of the phase-locked loop.

* * * * *